(12) United States Patent
Le et al.

(10) Patent No.: US 10,079,154 B1
(45) Date of Patent: *Sep. 18, 2018

(54) ATOMIC LAYER ETCHING OF SILICON NITRIDE

(71) Applicant: Lam Research Corporation, Fremont, CA (US)

(72) Inventors: Daniel Le, Santa Clara, CA (US); Gerardo Delgadino, Milpitas, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/463,374

(22) Filed: Mar. 20, 2017

(51) Int. Cl.
*H01L 21/311* (2006.01)
(52) U.S. Cl.
CPC .. *H01L 21/31116* (2013.01); *H01L 21/31144* (2013.01)
(58) Field of Classification Search
CPC .............. H01L 21/31116; H01L 21/31144
USPC ........................................................ 438/703
See application file for complete search history.

(56) References Cited

U.S. PATENT DOCUMENTS 9,779,956 B1 * 10/2017 Zhang ................ H01L 21/3065
2016/0196984 A1   7/2016 Lill

OTHER PUBLICATIONS

Notice of Allowance from U.S. Appl. No. 15/425,899 dated Jun. 26, 2017.
Zhang et al., U.S. Appl. No. 15/425,899, filed Feb. 6, 2017 entitled "Hydrogen Activated Atomic Layer Etching".
Romm et al., U.S. Appl. No. 15/425,901, filed Feb. 6, 2017 entitled "Dielectric Contact Etch".

* cited by examiner

*Primary Examiner* — Anthony Ho
(74) *Attorney, Agent, or Firm* — Beyer Law Group LLP

(57) ABSTRACT

A method for selectively etching SiN with respect to SiO or SiGe or Si of a structure is provided comprising providing a plurality of cycles of atomic layer etching. Each cycle comprises a fluorinated polymer deposition phase comprising flowing a fluorinated polymer deposition gas comprising a hydrofluorocarbon gas into the plasma processing chamber, forming the fluorinated polymer deposition gas into a plasma, which deposits a hydrofluorocarbon polymer layer on the structure, and stopping the flow of the fluorinated polymer deposition gas into the plasma processing chamber and an activation phase comprising flowing an activation gas comprising at least one of $NH_3$ or $H_2$ into the plasma processing chamber, forming the activation gas into a plasma, wherein plasma components from $NH_3$ or $H_2$ cause SiN to be selectively etched with respect to SiO or SiGe or Si, and stopping the flow of the activation gas into the plasma processing chamber.

16 Claims, 6 Drawing Sheets

ATOMIC LAYER ETCHING OF SILICON NITRIDE

BACKGROUND

The disclosure relates to a method of forming semiconductor devices on a semiconductor wafer. More specifically, the disclosure relates to etching silicon nitride in forming semiconductor devices.

In forming semiconductor devices, semiconductor devices may be formed with processes that etch silicon nitride.

SUMMARY

To achieve the foregoing and in accordance with the purpose of the present disclosure, a method for selectively etching SiN with respect to SiO or SiGe or Si of a structure in a plasma processing chamber is provided comprising providing a plurality of cycles of atomic layer etching. Each cycle comprises a fluorinated polymer deposition phase, comprising flowing a fluorinated polymer deposition gas comprising a hydrofluorocarbon gas into the plasma processing chamber, forming the fluorinated polymer deposition gas into a plasma, which deposits a hydrofluorocarbon polymer layer on the structure, and stopping the flow of the fluorinated polymer deposition gas into the plasma processing chamber and an activation phase, comprising flowing an activation gas comprising at least one of $NH_3$ or $H_2$ into the plasma processing chamber, forming the activation gas into a plasma, wherein plasma components from $NH_3$ or $H_2$ cause SiN to be selectively etched with respect to SiO or SiGe or Si, and stopping the flow of the activation gas into the plasma processing chamber.

These and other features of the present disclosure will be described in more details below in the detailed description and in conjunction with the following figures.

BRIEF DESCRIPTION OF THE DRAWINGS

The present disclosure is illustrated by way of example, and not by way of limitation, in the figures of the accompanying drawings and in which like reference numerals refer to similar elements and in which.

DETAILED DESCRIPTION OF THE PREFERRED EMBODIMENTS

The present disclosure will now be described in detail with reference to a few preferred embodiments thereof as illustrated in the accompanying drawings. In the following description, numerous specific details are set forth in order to provide a thorough understanding of the present disclosure. It will be apparent, however, to one skilled in the art, that the present disclosure may be practiced without some or all of these specific details. In other instances, well known process steps and/or structures have not been described in detail in order to not unnecessarily obscure the present disclosure.

Figure 1:
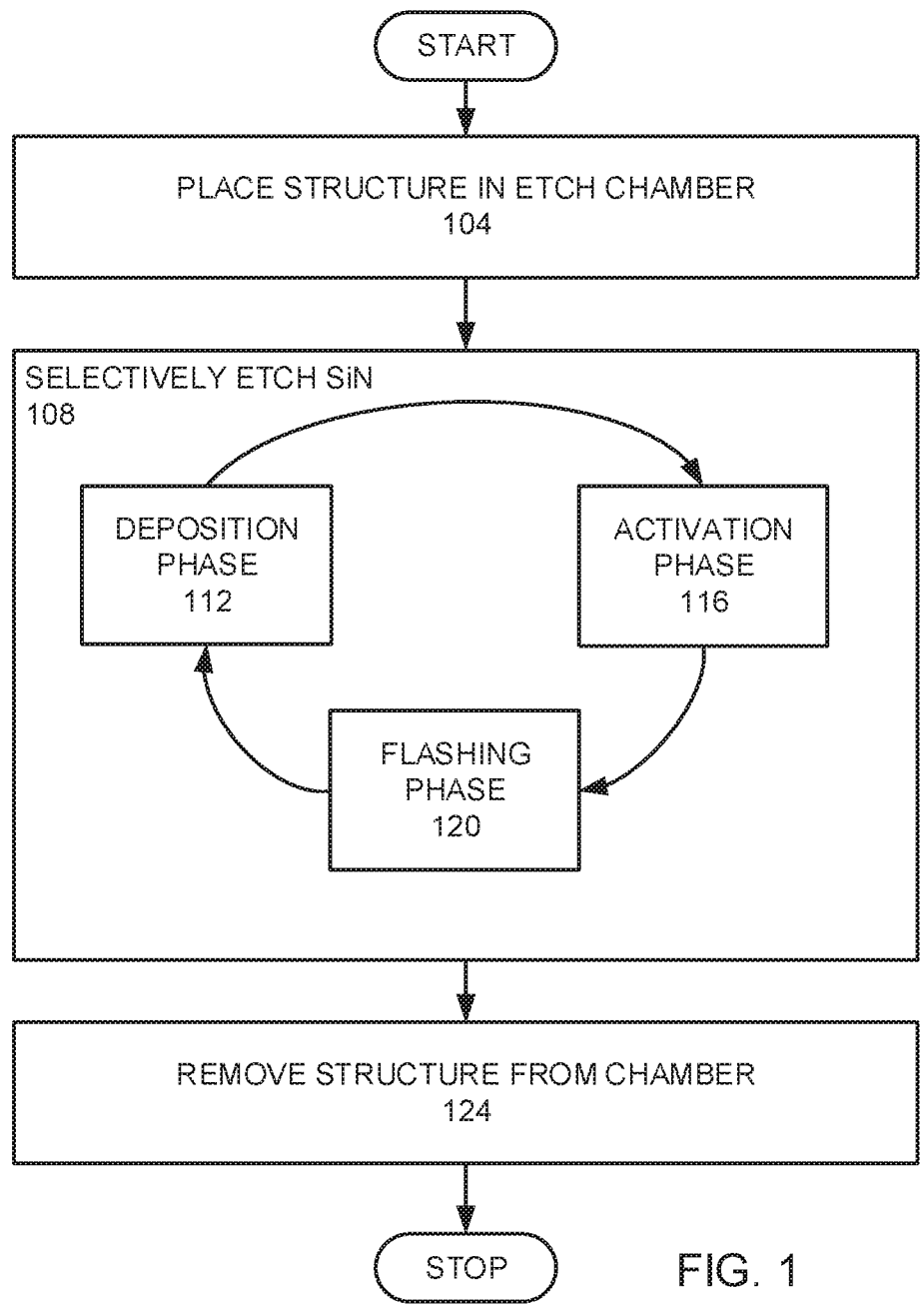
FIG. 1 is a high level flow chart of an embodiment.

FIG. 1 is a high level flow chart of an embodiment. In this embodiment, a substrate with a structure, such as a stack, is placed in a plasma processing chamber (step 104). A selective etch of SiN using a cyclical atomic layer etching is provided (step 108). Each cycle of the atomic layer etching process comprises a hydro-fluorinated polymer deposition phase (step 112), an activation phase (step 116), and a flashing phase (step 120). The substrate with the structure is removed from the plasma processing chamber (step 124).

Figure 2:
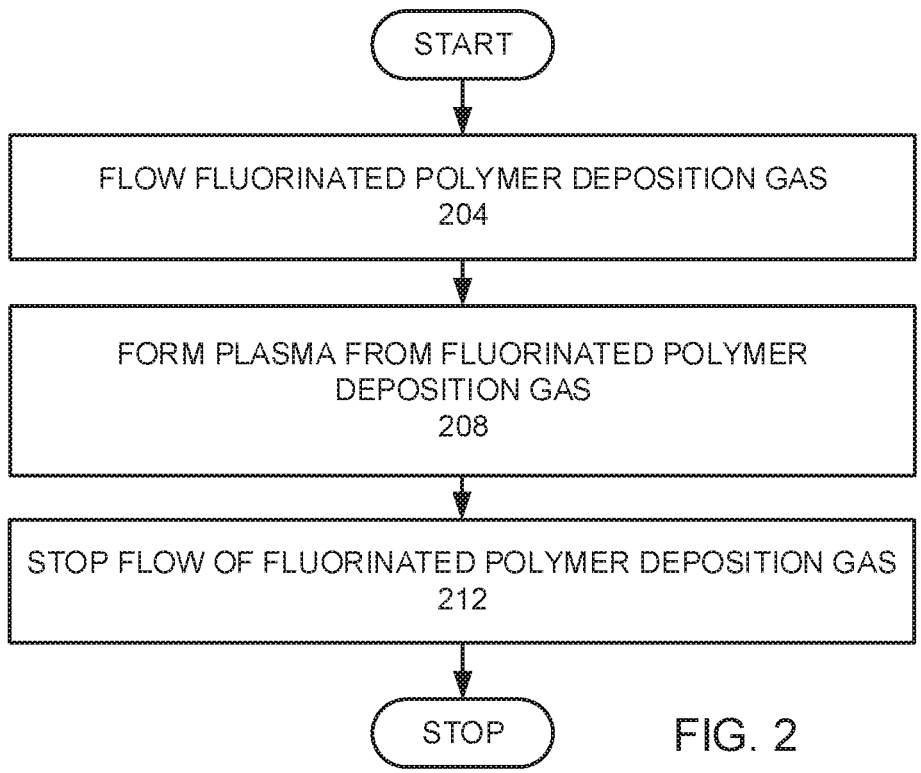
FIG. 2 is a more detailed flow chart of a fluorinated polymer deposition phase.
Figure 3:
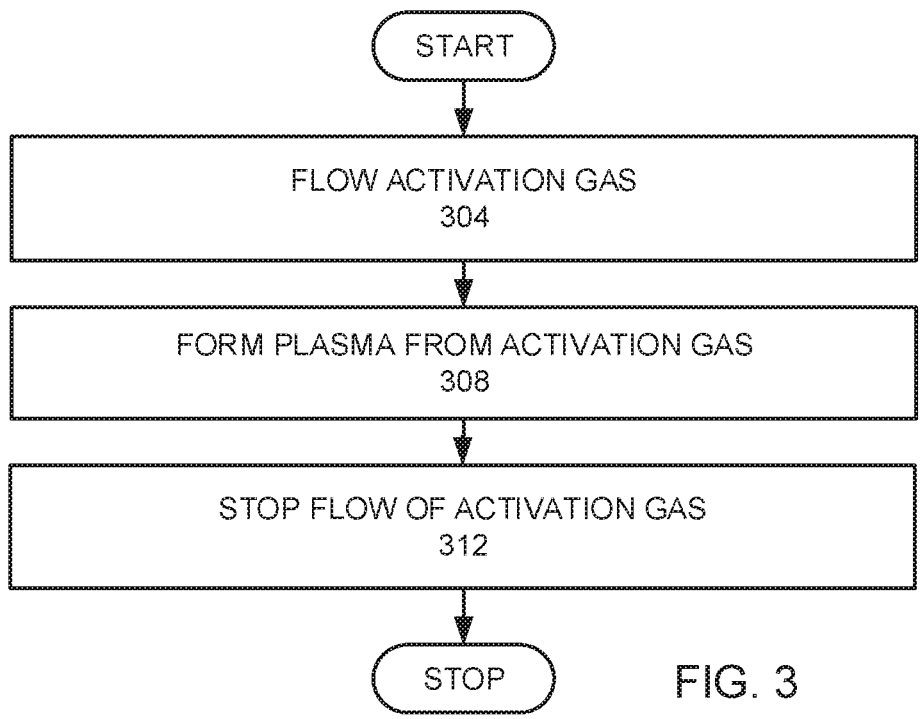
FIG. 3 is a more detailed flow chart of an activation phase.

FIG. 2 is a more detailed flow chart of hydro-fluorinated polymer deposition phase (step 112). A hydro-fluorinated polymer deposition gasses are flowed into the plasma processing chamber (step 204). The hydro-fluorinated polymer deposition gasses are formed into a plasma, which deposits hydro-fluorocarbon polymer on the structure (step 208). The flow of the hydro-fluorinated polymer deposition gasses are stopped (step 212). FIG. 3 is a more detailed flow chart of activation phase (step 116). An activation gas is flowed into the plasma processing chamber, where the activation gas comprises at least one of $NH_3$ or $H_2$ (step 304). The activation gas is formed into a plasma, which selectively etches SiN with respect to SiO or SiGe or Si (step 308). In the specification and claims, SiO, SiGe, and Si includes doped and undoped SiO, SiGE, and Si. The flow of the activation gas is stopped (step 312).

Example

Figure 4A:
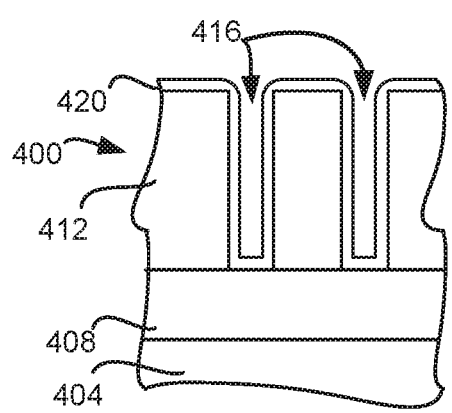
FIGS. 4A-D are schematic cross-sectional views of a structure processed according to an embodiment.

In an example, a substrate with a structure is placed in a plasma processing chamber (step 104). FIG. 4A is a schematic cross-sectional view of a structure 400, such as a stack, with a silicon substrate 404, under a silicon layer 408, under a dielectric layer 412 comprising SiO with features 416. A SiN layer 420 is deposited over the dielectric layer 412, which narrows the widths of the features 416. The structure 400 is placed in a plasma processing chamber.

Figure 5:
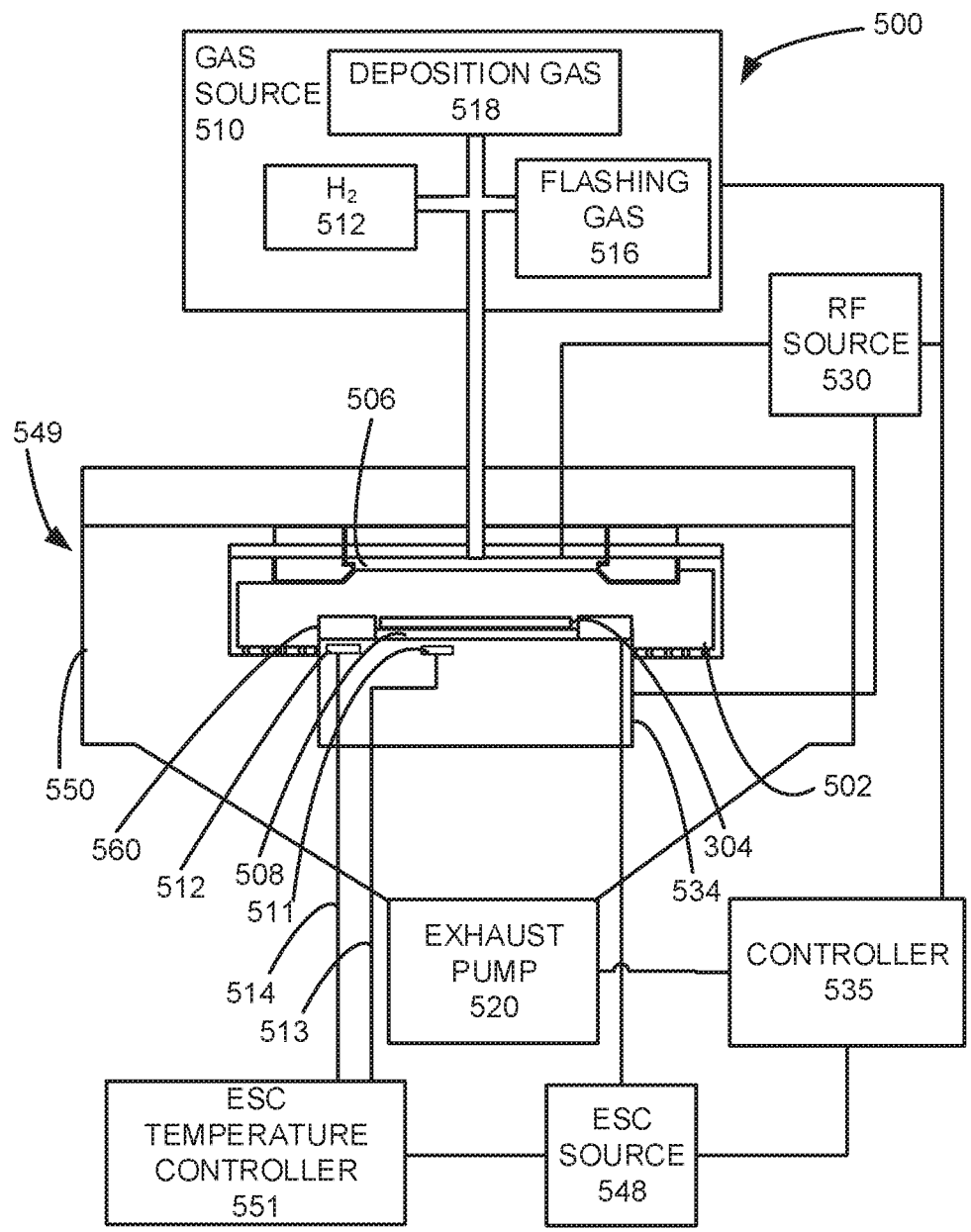
FIG. 5 is a schematic view of a plasma processing chamber that may be used in an embodiment.

FIG. 5 is a schematic view of a plasma processing chamber that may be used in an embodiment. In one or more embodiments, the plasma processing system 500 comprises a gas distribution plate 506 providing a gas inlet and an electrostatic chuck (ESC) 508, within a processing chamber 549, enclosed by a chamber wall 550. Within the processing chamber 549, the substrate 404 is positioned on top of the ESC 508. The ESC 508 may provide a bias from the ESC source 548. A gas source 510 is connected to the plasma processing chamber 549 through the distribution plate 506. In this embodiment, the gas source 510 comprises a $H_2$ gas source 512, a flashing gas source 516, and a deposition gas sources 518. The gas source 510 may have additional gas sources. Each gas source may comprise multiple gas sources. An ESC temperature controller 551 is connected to the ESC 508, and provides temperature control of the ESC 508. In this example, a first connection 513 provides power to an inner heater 511 for heating an inner zone of the ESC 508 and a second connection 514 provides power to an outer heater 512 for heating an outer zone of the ESC 508. An RF source 530 provides RF power to a lower electrode 534 and an upper electrode, which in this embodiment is the gas distribution plate 506. In a preferred embodiment, 2 MHz, 60 MHz, and optionally, 27 MHz power sources make up the RF source 530 and the ESC source 548. In this embodiment, one generator is provided for each frequency. In other embodiments, the generators may be in separate RF sources, or separate RF generators may be connected to different electrodes. For example, the upper electrode may have inner and outer electrodes connected to different RF sources. Other arrangements of RF sources and electrodes may be used in other embodiments, such as in another embodiment the upper electrodes may be grounded. A controller 535 is controllably connected to the RF source 530, the ESC source 548, an exhaust pump 520, and the etch gas source 510. An example of such a plasma processing chamber is the Exelan Flex™ etch system manufactured by Lam Research Corporation of Fremont, Calif. The process chamber can be a CCP (capacitive coupled plasma) reactor or an ICP (inductive coupled plasma) reactor.

Figure 6:
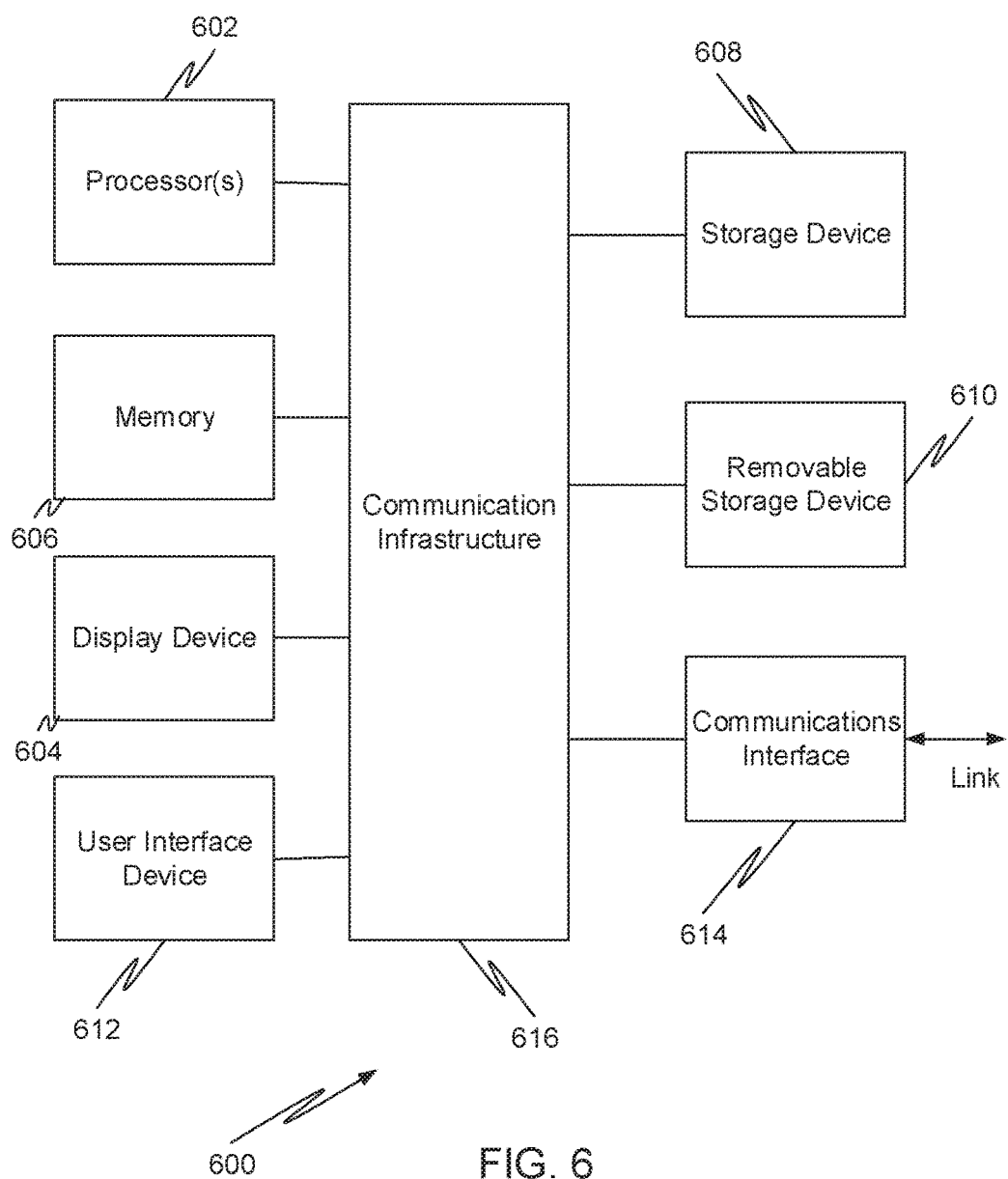
FIG. 6 is a schematic view of a computer system that may be used in practicing an embodiment.

FIG. 6 is a high level block diagram showing a computer system 600, which is suitable for implementing a controller 535 used in embodiments. The computer system may have many physical forms ranging from an integrated circuit, a printed circuit board, and a small handheld device, up to a huge super computer. The computer system 600 includes one or more processors 602, and further can include an electronic display device 604 (for displaying graphics, text, and other data), a main memory 606 (e.g., random access memory (RAM)), storage device 608 (e.g., hard disk drive), removable storage device 610 (e.g., optical disk drive), user interface devices 612 (e.g., keyboards, touch screens, keypads, mice or other pointing devices, etc.), and a communication interface 614 (e.g., wireless network interface). The communication interface 614 allows software and data to be transferred between the computer system 600 and external devices via a link. The system may also include a communications infrastructure 616 (e.g., a communications bus, cross-over bar, or network) to which the aforementioned devices/modules are connected.

Information transferred via communications interface 614 may be in the form of signals such as electronic, electromagnetic, optical, or other signals capable of being received by communications interface 614, via a communication link that carries signals and may be implemented using wire or cable, fiber optics, a phone line, a cellular phone link, a radio frequency link, and/or other communication channels. With such a communications interface, it is contemplated that the one or more processors 602 might receive information from a network, or might output information to the network in the course of performing the above-described method steps. Furthermore, method embodiments may execute solely upon the processors or may execute over a network, such as the Internet, in conjunction with remote processors that share a portion of the processing.

The term "non-transient computer readable medium" is used generally to refer to media such as main memory, secondary memory, removable storage, and storage devices, such as hard disks, flash memory, disk drive memory, CD-ROM, and other forms of persistent memory, and shall not be construed to cover transitory subject matter, such as carrier waves or signals. Examples of computer code include machine code, such as one produced by a compiler, and files containing higher level code that are executed by a computer using an interpreter. Computer readable media may also be computer code transmitted by a computer data signal embodied in a carrier wave and representing a sequence of instructions that are executable by a processor.

After the structure 400 with the substrate 404 has been placed into the plasma processing chamber 549, cyclical atomic layer etching is provided (step 108). Each cycle of the atomic layer etching process in this embodiment comprises a fluorinated polymer deposition phase (step 112), an activation phase (step 116), and a flashing phase (step 120). FIG. 2 is a more detailed flow chart of fluorinated polymer deposition phase (step 112). A fluorinated polymer deposition gas is flowed into the plasma processing chamber (step 204). In this embodiment, the flowing the fluorinated polymer deposition gas flows between 10 to 100 sccm of $CH_3F$, 50 to 400 sccm $H_2$, and 0 to 800 sccm Ar. The fluorinated polymer deposition gas is formed into a plasma, which deposits a hydrofluorocarbon polymer on the structure (step 208). In this embodiment, 30-200 Watts of RF power is provided at 27 MHz and 30-300 Watts of RF power is provided at 60 MHz. A bias ranging from −30V to −200V volts is provided to accelerate plasma components to the structure 400 to provide the deposition. The flow of the fluorinated polymer deposition gas is stopped (step 212) after 2 to 6 seconds.

Figure 4B:
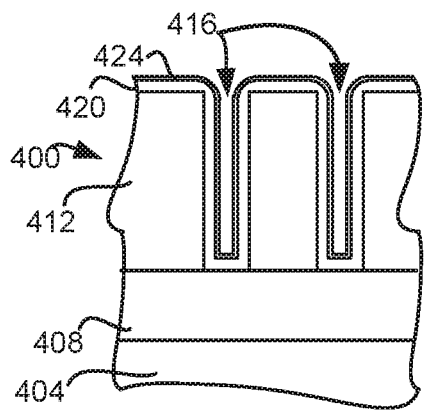

FIG. 4B is a schematic cross-sectional view of a structure 400 after the fluorinated polymer deposition phase is completed. A thin layer or coating of fluorinated polymer 424 is deposited on the structure 400. The coating of fluorinated polymer 424 is not drawn to scale, but is drawn thicker to better facilitate understanding. In this embodiment, the main objective of this phase is not to etch, but to deposit the fluorinated polymer coating 424, in some cases, etch of the substrate can be observed during the deposition phase.

FIG. 3 is a more detailed flow chart of activation phase (step 116). An activation gas is flowed into the plasma processing chamber, where the activation gas comprises at least one of $NH_3$ or $H_2$ (step 304). In this example, the activation gas is 10-800 sccm $H_2$. The activation gas is formed into a plasma, which causes SiN to be selectively etched with respect to SiGe or Si or SiO (step 308). In this embodiment, 50-400 Watts of RF power is provided at 27 MHz and 50-400 Watts of RF power is provided at 60 MHz. A bias of −30 to −300 volts is provided to accelerate plasma components to the structure 400 to cause activation. The flow of the activation gas is stopped (step 312) after 2 to 8 seconds.

Figure 4C:
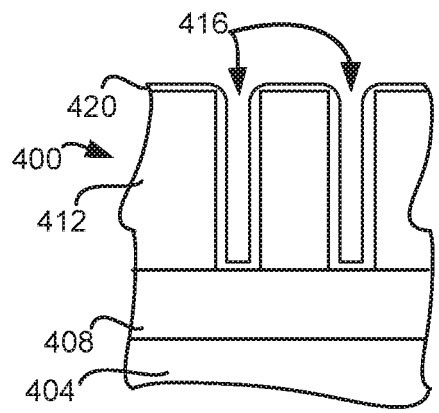

FIG. 4C is a schematic cross-sectional view of a structure 400 after the activation phase is completed. The plasma generated from the activation gas directionally or anisotropically etches the SiN layer 420. A layer of the SiN layer 420 is shown as being etched away. The directional etch of the SiN layer selectively etches horizontal surfaces with respect to vertical surfaces.

Figure 7:
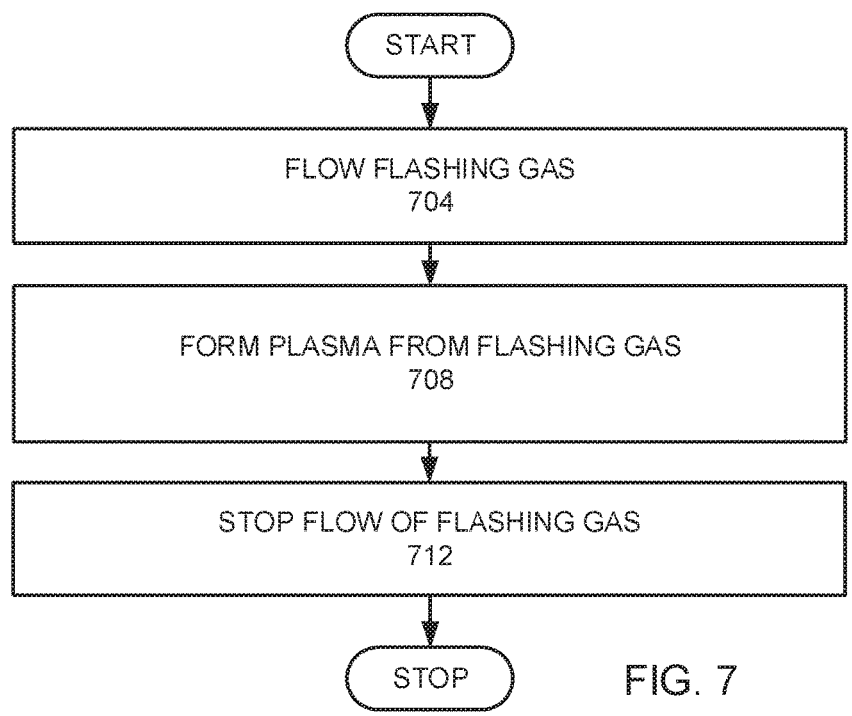
FIG. 7 is a more detailed flow chart of a flashing phase.

FIG. 7 is a more detailed flow chart of the flashing phase (step 120). A flashing gas is flowed into the plasma processing chamber, where the flashing gas comprises $H_2$ and at least one of $O_2$ or $CO_2$ (step 704). In this example, the flashing gas is 100-800 sccm $H_2$ and 1-10 sccm $O_2$. The flashing gas is formed into a plasma (step 708). In this embodiment, 50-400 Watts of RF power is provided at 27 MHz and 60-400 Watts of RF power is provided at 60 MHz. A bias of −30 to −300 volts is provided to accelerate plasma components to the structure 400 to cause flashing, which removes any remaining polymer residue. The flow of the flashing gas is stopped (step 712) after 2 to 8 seconds.

Figure 4D:
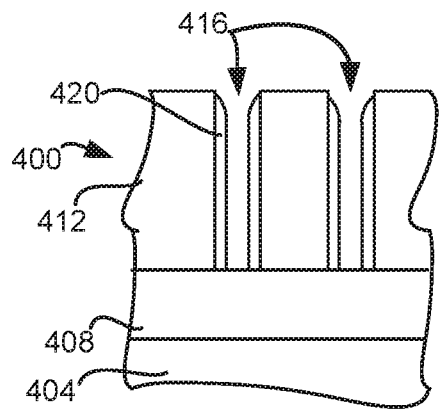

The cyclical process is repeated many times. In this example, the process is repeated from 5 to 20 times. FIG. 4D is a schematic cross-sectional view of a structure 400 after the atomic layer etch has been performed for over 10 cycles. The atomic layer etch selectively etched the SiN layer 420 with respect to the dielectric layer 412. In this example, horizontal surfaces of the SiN layer 420 have been selectively etched with respect to the dielectric layer 412 of SiO and vertical surfaces of the SiN layer 420. The SiN layer 420 is etched through to the silicon layer 408 below to form a contact with a reduced CD. The silicon layer 420 below the contact may be a doped silicon to form a source or drain or may contain a metal contact.

In other embodiments, the fluorinated polymer deposition gas is a hydrofluorocarbon of $CH_3F$, $CH_2F_2$, or $CHF_3$ and may further comprise at least one of $CH_4$, $H_2$ or Ar. In addition to a hydrofluorocarbon, the fluorinated polymer deposition gas may further comprise CO, $O_2$, $CO_2$, and/or inert gas like Ar. Preferably, the activation gas is fluorine free and inert bombardment gas free. More preferably, the activation gas consists essentially of $H_2$ or $NH_3$. Most preferably, the activation gas consists essentially of $H_2$. Preferably, the bias voltage during the fluorinated polymer deposition phase and the activation phase has a magnitude of between 30 to 300 volts. More preferably, the bias voltage during the fluorinated polymer deposition phase and the activation phase has a magnitude between 50 to 150 volts. This means that the absolute value of the bias voltage is between 30 to 300 volts and more preferably between 50 to 150 volts.

The amount or thickness of the fluorinated polymer provides a self-limitation of the amount of etching during the activation phase. In the specification and claims, atomic layer etching is defined as a self-limited etching process, such as the self-limitation of the activation process due to the limited presence of fluorinated polymer.

In this embodiment, the SiN layer reduces the CD of the etched features. Preferably, the SiN is selectively etched with respect to SiO and SiGe and Si at a ratio of at least 5:1. More preferably, the SiN is selectively etched with respect to SiGe and Si and SiO at a ratio of at least 10:1. In various embodiments, the doped Si may be silicon doped with carbon or P-doped Si, and the doped SiGE may be doped with boron.

Figure 8A:
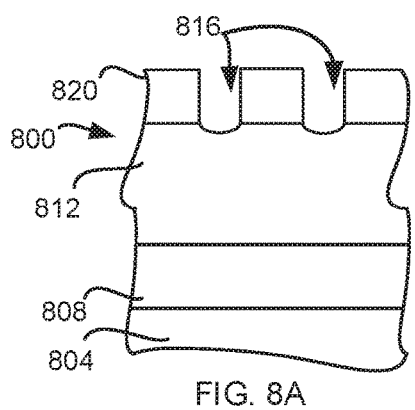
FIGS. 8A-B are schematic cross-sectional views of a structure processed according to another embodiment.

FIG. 8A is a schematic cross-sectional view of a structure 800, such as a stack, with a silicon substrate 804, under a SiO layer 808, under a SiN layer 812 under a SiO mask 820 with features 816, used in another embodiment. Parts of the SiN layer 812 may be recessed, since during the patterning of the SiO mask 820, part of the SiN layer 812 may be etched. One or more intermediate layers may be placed between the various layers of the structure 800. The substrate 804 with the structure 800 is placed in a plasma processing chamber (step 104). A cyclical atomic layer etching is provided (step 108). Each cycle of the atomic layer etching process comprises a fluorinated polymer deposition phase (step 112) and an activation phase (step 116). In this embodiment, the atomic layer etching process does not include a flashing phase. FIG. 2 is a more detailed flow chart of fluorinated polymer deposition phase (step 112). A fluorinated polymer deposition gas is flowed into the plasma processing chamber (step 204). The fluorinated polymer deposition gas is formed into a plasma, which deposits fluorocarbon polymer on the structure (step 208). The flow of the fluorinated polymer deposition gas is stopped (step 212). FIG. 3 is a more detailed flow chart of activation phase (step 116). An activation gas is flowed into the plasma processing chamber, where the activation gas comprises at least one of $NH_3$ or $H_2$ (step 304). The activation gas is formed into a plasma, which selectively etches SiN with respect to SiO (step 308). The flow of the activation gas is stopped (step 312). After several cycles of the atomic layer etching, the substrate 804 with the structure 800 is removed from the plasma processing chamber (step 124).

Figure 8B:
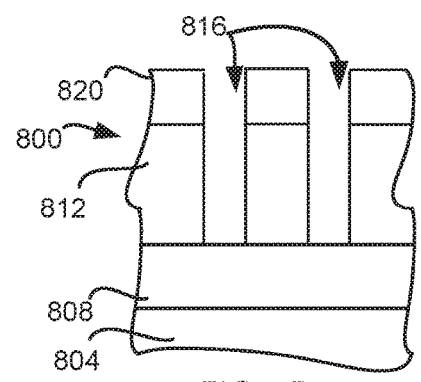

FIG. 8B is a schematic cross-sectional view of a structure 800 after the SiN layer 812 has been etched. The atomic layer etching is able to selectively etch the SiN layer 812 without or with minimal etching of the SiO mask 820 and the SiO layer 808. Such an embodiment provides features with a CD of less than 20 nm and a height to width aspect ratio of greater than 10:1.

Without being bound by theory, it is believed that the activation gas that is comprised essentially of $H_2$ forms hydrogen ions. The hydrogen ions are accelerated to the structure 800. Because the hydrogen ions are light, minimal etching is caused by bombardment. It is believed that a chemical reaction caused by the hydrogen ions provides most of the SiN etching with minimal or no etching of SiO, Si, and SiGe.

While this disclosure has been described in terms of several preferred embodiments, there are alterations, modifications, permutations, and various substitute equivalents, which fall within the scope of this disclosure. It should also be noted that there are many alternative ways of implementing the methods and apparatuses of the present disclosure. It is therefore intended that the following appended claims be interpreted as including all such alterations, modifications, permutations, and various substitute equivalents that fall within the true spirit and scope of the present disclosure.

What is claimed is:

1. A method for selectively etching SiN with respect to SiO or SiGe or Si of a structure in a plasma processing chamber, comprising providing a plurality of cycles of atomic layer etching, wherein each cycle comprises:
   a fluorinated polymer deposition phase, comprising:
      flowing a fluorinated polymer deposition gas comprising a hydrofluorocarbon gas into the plasma processing chamber;
      forming the fluorinated polymer deposition gas into a plasma, which deposits a hydrofluorocarbon polymer layer on the structure; and
      stopping the flow of the fluorinated polymer deposition gas into the plasma processing chamber; and
   an activation phase, comprising:
      flowing an activation gas comprising at least one of $NH_3$ or $H_2$ into the plasma processing chamber;
      forming the activation gas into a plasma, wherein plasma components from $NH_3$ or $H_2$ cause SiN to be selectively etched with respect to SiO or SiGe or Si; and
      stopping the flow of the activation gas into the plasma processing chamber.

2. The method, as recited in claim 1, wherein the activation gas comprises $H_2$.

3. The method, as recited in claim 2, wherein the activation gas is fluorine and inert bombardment gas free.

4. The method, as recited in claim 3, further comprising a flashing phase after the activation phase, comprising:
   flowing a flashing gas comprising $H_2$ and at least one of $O_2$ or $CO_2$ into the plasma processing chamber;
   forming the flashing gas into a plasma, wherein the plasma strips polymer; and
   stopping the flow of the flashing gas.

5. The method, as recited in claim 3, wherein the fluorinated polymer deposition phase provides a bias voltage with a magnitude of between 30 to 300 volts and the activation phase provides a bias voltage with a magnitude of between 30 to 300 volts.

6. The method, as recited in claim 5, wherein the hydrofluorocarbon gas comprises at least one of $CH_3F$, $CH_2F_2$, or $CHF_3$.

7. The method, as recited in claim 6, wherein the fluorinated polymer deposition gas further comprises at least one of $CH_4$ or $H_2$ or Ar.

8. The method, as recited in claim 7, the activation gas consists essentially of $H_2$.

9. The method, as recited in claim 8, wherein the activation phase is self limiting dependent on a thickness of fluorinated polymer deposited, since fluorine from the fluorinated polymer is used for etching during the activation phase.

10. The method, as recited in claim 1, wherein the activation gas is fluorine and inert bombardment gas free.

11. The method, as recited in claim 1, further comprising a flashing phase after the activation phase, comprising:
   flowing a flashing gas comprising $H_2$ and at least one of $O_2$ or $CO_2$ into the plasma processing chamber;
   forming the flashing gas into a plasma, wherein the plasma strips polymer; and
   stopping the flow of the flashing gas.

12. The method, as recited in claim 1, wherein the fluorinated polymer deposition phase provides a bias voltage with a magnitude of between 30 to 300 volts and the activation phase provides a bias voltage with a magnitude of between 30 to 300 volts.

13. The method, as recited in claim 1, wherein the hydrofluorocarbon gas comprises at least one of $CH_3F$, $CH_2F_2$, or $CHF_3$.

14. The method, as recited in claim 1, wherein the fluorinated polymer deposition gas further comprises at least one of $CH_4$ or $H_2$ or Ar.

15. The method, as recited in claim 1, the activation gas consists essentially of $H_2$.

16. The method, as recited in claim 1, wherein the activation phase is self limiting dependent on a thickness of fluorinated polymer deposited, since fluorine from the fluorinated polymer is used for etching during the activation phase.

* * * * *